US010562068B2

(12) United States Patent
Osman et al.

(10) Patent No.: US 10,562,068 B2
(45) Date of Patent: Feb. 18, 2020

(54) ULTRASONIC DEVICE HAVING LARGE RADIATING AREA

(71) Applicant: Sembcorp Marine Repairs & Upgrades Pte. Ltd., Singapore (SG)

(72) Inventors: Hafiiz Bin Osman, Singapore (SG); Margaret Lucas, Scotland (GB); Fannon Chwee Ning Lim, Singapore (SG); Prakash Balasubramaniam, Singapore (SG)

(73) Assignee: SEMBCORP MARINE REPAIRS & UPGRADES PTD. LTD., Singapore (SG)

( * ) Notice: Subject to any disclaimer, the term of this patent is extended or adjusted under 35 U.S.C. 154(b) by 391 days.

(21) Appl. No.: 15/475,993

(22) Filed: Mar. 31, 2017

(65) Prior Publication Data

US 2018/0287585 A1 Oct. 4, 2018

(51) Int. Cl.

*H01L 41/09* (2006.01)
*B06B 1/06* (2006.01)
*G10K 11/04* (2006.01)

(52) U.S. Cl.

CPC .................................. *B06B 1/0611* (2013.01)

(58) Field of Classification Search

CPC ... B06B 1/0611; B06B 2201/70; G10K 11/04; G10K 11/22; G10K 11/24
USPC .......... 310/311, 323.01–323.19, 323.21, 328
See application file for complete search history.

(56) References Cited

U.S. PATENT DOCUMENTS 3,113,225 A * 12/1963 Claus ........................ B06B 3/00 101/169
3,601,084 A * 8/1971 Biro .......................... B06B 3/00 116/137 A
4,307,128 A * 12/1981 Nagano ..................... C23C 2/32 427/601

(Continued)

FOREIGN PATENT DOCUMENTS

JP 2011-143517 A * 7/2011 ............... B24B 1/04
JP 6257552 B2 * 1/2018 ............ A01M 29/18

*Primary Examiner* — Thomas M Dougherty
(74) *Attorney, Agent, or Firm* — Patterson + Sheridan, LLP

(57) ABSTRACT

The present invention relates a power ultrasound device for fluids processing. An ultrasonic resonator comprises: an exciter section having a longitudinal axis and dimensioned to be resonant in a direction along the longitudinal axis when the exciter section is energized with high frequency vibrations; and a radiator section having a connection stub and coupled to the exciter section through the connection stub, wherein the radiator section is configured to receive the vibrations from the exciter section and transmit the vibrations as acoustic waves, wherein an axial length of the exciter section is less than a half-wavelength, wherein the connection stub completes the half-wavelength when coupled to the excited section to allow the ultrasonic resonator operate in resonance at design frequency. The radiator section includes a radiator body having at least three sides to provide a plurality of external radiating surfaces, and two opposite faces having a plurality of orifices formed therein, wherein walls of the orifices are configured to provide a plurality of internal radiating surfaces, and wherein the internal and the external surfaces are configured to transmit the vibrations as acoustic waves.

19 Claims, 9 Drawing Sheets

(56) References Cited

U.S. PATENT DOCUMENTS 4,315,181 A * 2/1982 Holze, Jr. ................. B06B 3/00
310/323.19
4,363,992 A * 12/1982 Holze, Jr. ................. B06B 3/00
310/323.19
5,057,182 A * 10/1991 Wuchinich ................ B06B 3/00
156/580.1

* cited by examiner

ULTRASONIC DEVICE HAVING LARGE RADIATING AREA

FIELD OF THE INVENTION

The present invention is in the technical field of power ultrasound, more particularly in the technical field of power ultrasound devices for fluids processing.

BACKGROUND OF THE INVENTION

Power ultrasound devices comprise of active component which converts electrical energy to mechanical energy. The vibrational output of the active component is transferred to a resonant structure (also referred to as horn, radiator, or resonator) which transfers the acoustic energy to the process fluids. The electrical energy transfer to the electro-mechanical device is generated by a power supply designed to deliver voltage close to the resonant frequency of the power ultrasound device. Present ultrasonic devices, such as longitudinally vibrating horns and the like, radially vibrating horns and the like, typically have small radiating surface area compare to its structural mass. Such devices concentrate high intensity acoustic energy to a very small surface area, generating an effective region that is confined to a very small volume near the tip of the device. Using such devices for fluids processes such as disinfection, agglomeration, deaeration, degassing, chemical reactions, catalysis, emulsification, deagglomeration, etc., would require that the ultrasound-assisted continuous process be limited to low flow rates of a few liters per minute or the ultrasound-assisted batch process be carried out at low volumes of a few liters and/or long processing times of a few minutes to a few hours. Typically, the increase in ultrasonic intensity or ultrasonic energy density by increasing the electrical energy to supply to the ultrasonic device can bring about an improvement in processing times and flow rates. However, an upper limit exists above which further increase in electrical energy will not generate useful acoustic energy due to the onset of the “bubble shielding” regime at high vibrational amplitudes. Because present devices have small radiating surface areas, the “bubble shielding” regime occur at relatively low input power levels. Therefore, a high-flow or high-volume ultrasound-assisted fluids processing application would require the use of a multitude of the ultrasonic horns, transducers, and power supplies to deliver the ultrasonic intensity or ultrasonic energy density required for the process. The use of multiple devices and their auxiliaries to meet the required process flow-rates and volumes increases capital and running costs. Newer power ultrasound devices attempt to overcome the above limitations by increasing the radiating surface area.

However, the increase in vibrating surface area is typically accompanied by a corresponding increase in the devices’ structural mass. Thus, more electrical power is needed to resonate the device to the desired vibrational amplitude.

SUMMARY OF THE INVENTION

According to a first aspect of the invention, an ultrasonic resonator is provided which comprises:

an exciter section having a longitudinal axis and dimensioned to be resonant in a direction along the longitudinal axis when the exciter section is energized with high frequency vibrations; and a radiator section having a connection stub and coupled to the exciter section through the connection stub, wherein the radiator section is configured to receive the vibrations from the exciter section and transmit the vibrations as acoustic waves, wherein an axial length of the exciter section is less than a half-wavelength, wherein the connection stub completes the half-wavelength when coupled to the excited section to allow the ultrasonic resonator operate in resonance at design frequency.

According to one embodiment of the first aspect, the radiator section includes a radiator body having at least three sides to provide a plurality of external radiating surfaces, and two opposite faces having a plurality of orifices formed therein, wherein walls of the orifices are configured to provide a plurality of internal radiating surfaces, and wherein the internal and the external surfaces are configured to transmit the vibrations as acoustic waves.

According to one embodiment of the first aspect, the orifices are arranged as a plurality of orifice levels, wherein orifices of each orifice level, other than a primary orifice level having a single orifice, are centered about the single orifice and arranged at increasing radial distance from the single orifice with increasing orifice level.

According to one embodiment of the first aspect, the radiator body is provided with a plurality of orifice-links connecting at least some of the orifices of adjacent orifice levels.

According to one embodiment of the first aspect, the radiator body is provided with a plurality of orifice-links connecting at least some of the orifices of adjacent orifice levels other than the single orifice of the primary orifice level.

According to one embodiment of the first aspect, at least some of the orifices have depths which partially extend through a thickness of the radiator body.

According to one embodiment of the first aspect, at least some of the orifices have depths which fully extend through a thickness of the radiator body.

According to one embodiment of the first aspect, the exciter section includes an electromechanical energy conversion device configured to generate the vibrations.

According to one embodiment of the first aspect, the exciter section is substantially cylindrical with circular cross-sections having variable diameters.

According to one embodiment of the first aspect, the exciter section includes a mounting flange arranged at a nodal region of the vibrations and dimensioned to prevent wetting of active electromechanical elements, such as piezoelectric elements or magneto-restrictive elements, of the exciter section upon mounting the ultrasonic resonator into a pipe or tank.

According to a second aspect of the invention, an ultrasonic radiator section is provided which comprises:

a radiator body having an array of orifices, wherein each member of the array comprises a plurality of orifices arranged as a plurality of orifice levels, wherein orifices of each orifice level, other than a primary orifice level having a single orifice, are centered about the single orifice and arranged at increasing radial distance from the single orifice with increasing orifice level.

According to one embodiment of the second aspect, a number of orifices in the primary orifice level is the same as a number of array members.

According to one embodiment of the second aspect, the radiator body is provided with a plurality of orifice-links connecting at least some of the orifices of adjacent orifice levels.

According to one embodiment of the second aspect, the radiator body is provided with a plurality of orifice-links connecting at least some of the orifices of adjacent orifice levels other than the single orifice of the primary orifice level.

According to a third aspect of the invention, an ultrasonic resonator is provided which comprises:

an intermediate section adapted to be connected to an external exciter and having a longitudinal axis and dimensioned to be resonant in a direction along the longitudinal axis when the intermediate section is energized with high frequency vibrations from the external exciter;

a radiator section having a connection stub and coupled to the intermediate section through the connection stub, wherein the radiator section is configured to receive the vibrations from the intermediate section and transmit the vibrations as acoustic waves, wherein an axial length of the intermediate section is less than a half-wavelength, wherein the connection stub completes the half-wavelength when coupled to the intermediate section to allow the ultrasonic resonator operate in resonance at design frequency.

According to one embodiment of the third aspect, the radiator section includes a radiator body having at least three sides to provide a plurality of external radiating surfaces, and two opposite faces having a plurality of orifices formed therein, wherein walls of the orifices are configured to provide a plurality of internal radiating surfaces, and wherein the internal and the external surfaces are configured to transmit the vibrations as acoustic waves.

According to one embodiment of the third aspect, the orifices are arranged as a plurality of orifice levels, wherein orifices of each orifice level, other than a primary orifice level having a single orifice, are centered about the single orifice and arranged at increasing radial distance from the single orifice with increasing orifice level.

According to one embodiment of the third aspect, the radiator body is provided with a plurality of orifice-links connecting at least some of the orifices of adjacent orifice levels.

According to one embodiment of the third aspect, the radiator body is provided with a plurality of orifice-links connecting at least some of the orifices of adjacent orifice levels other than the single orifice of the primary orifice level.

BRIEF DESCRIPTION OF THE DRAWINGS

The present invention is illustrated by way of example, and not by way of limitation, in the figures of the accompanying drawings and in which the reference annotation refer to similar elements and in which:

In FIG. 9*a* there is shown a circular radiator having external diameter $D_o$, the primary orifice diameter $D_P$, secondary orifices diameter $D_S$ and radius $r_S$, which refers to a distance from the center of the circular face to the center of the secondary orifice, tertiary orifices diameter $D_T$ and radius $r_T$ which refers to a distance from the center of the circular face to the center of the tertiary orifice, and the height $H_{stub}$ of the connection stub.

FIG. 9*b* is also applicable to FIG. 5, FIG. 6, FIG. 7, FIG. 8, FIG. 10, FIG. 11, FIG. 12, FIG. 13, FIG. 14, FIG. 15, FIG. 16, and FIG. 17, but not limiting to these examples or embodiments.

FIG. 9*c* is also applicable to FIG. 5, FIG. 6, FIG. 7, FIG. 8, FIG. 10, FIG. 11, FIG. 12, FIG. 13, FIG. 14, FIG. 15, FIG. 16, and FIG. 17, but not limiting to these examples or embodiments.

FIG. 9*d* is also applicable to FIG. 5, FIG. 6, FIG. 7, FIG. 8, FIG. 10, FIG. 11, FIG. 12, FIG. 13, FIG. 14, FIG. 15, FIG. 16, and FIG. 17, but not limiting to these examples or embodiments.

FIG. 9*e* is also applicable to FIG. 5, FIG. 6, FIG. 7, FIG. 8, FIG. 10, FIG. 11, FIG. 12, FIG. 13, FIG. 14, FIG. 15, FIG. 16, and FIG. 17, but not limiting to these examples or embodiments.

DETAILED DESCRIPTION OF THE INVENTION

Figure 2:
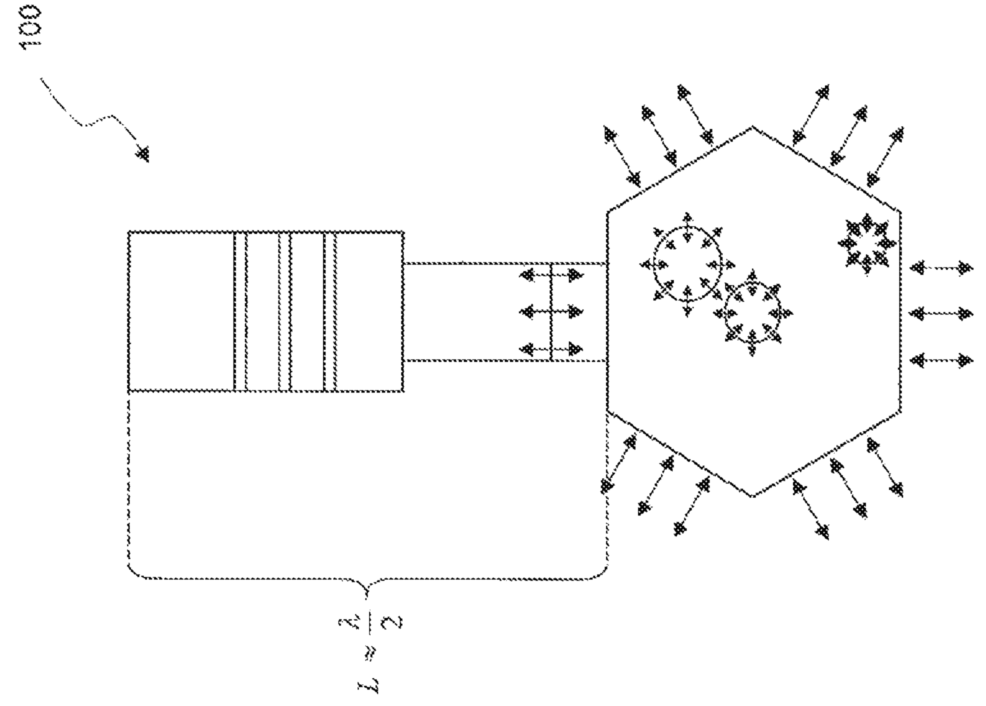
FIG. 2 is a front view of the same embodiment of FIG. 1 showing the vibrational directions at the interface between the exciter and the radiator, external surfaces of the radiator section, and internal surfaces of the radiator section.

In the following description, numerous specific details are set forth in order to provide a thorough understanding of various illustrative embodiments of the invention. It will be understood, however, to one skilled in the art, that embodiments of the invention may be practiced without some or all of these specific details. It is understood that the terminology used herein is for the purpose of describing particular embodiments only, and is not intended to limit the scope of the invention. In the drawings, like reference numerals refer to same or similar functionalities or features throughout the several views.

Figure 1:
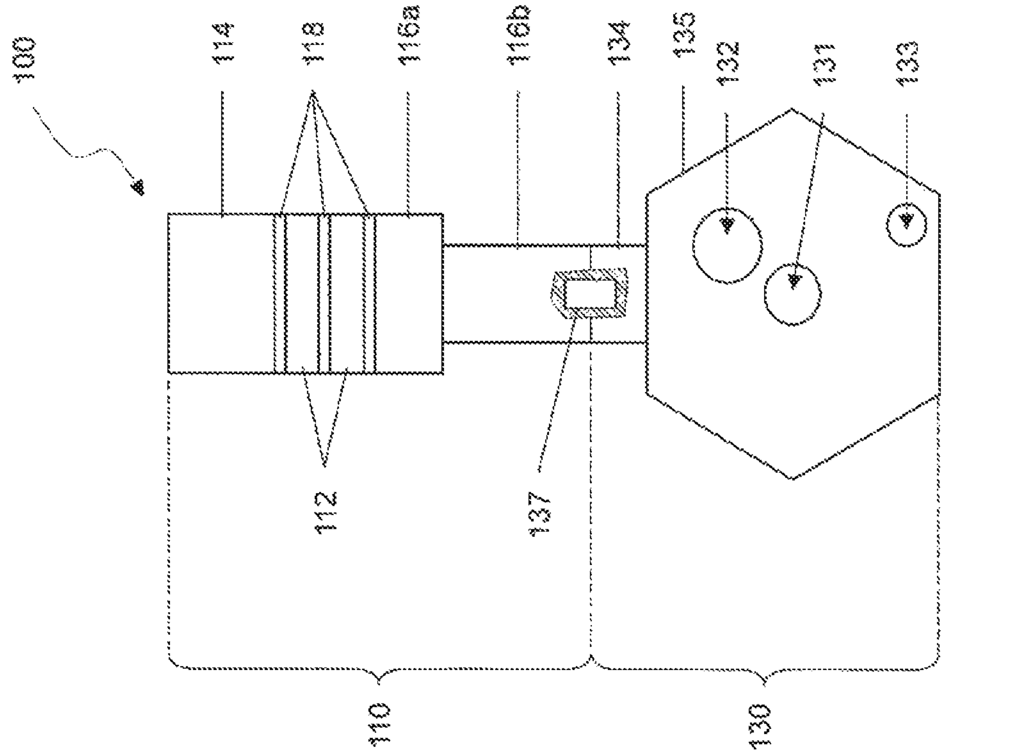
FIG. 1 is a front view of an embodiment comprising an exciter section coupled to a radiator section.

Referring now to the invention in more detail, in FIG. 1 there is shown a "self-excited" ultrasonic resonator 100 having an exciter section 110 comprising piezoelectric elements 112, clamped between end masses 114, 116*a* by means of screw fastener(s). The piezoelectric elements 112 are arranged in a stack comprising alternate layers of piezoelectric elements 112 and electrodes 118. The piezoelectric elements 112 are arranged such that the poling direction of an element 112 opposes the poling direction of adjacent elements 112. The piezoelectric elements 112 and the electrodes 118 are in the form of circular rings such that the assembled stack is a cylinder with a hole running through its axis. The back mass 114 is constructed from a material with relatively high acoustic impedance and is designed to direct most of the acoustic wave towards the front mass 116*a*, 116*b*. A hole runs through the axis of the back mass 114. The front mass 116*a*, 116*b* is constructed from a material with relatively small acoustic impedance compared to the back mass 114, and has a threaded hole running through its axis. By means of a fastener (not shown), the piezoelectric stack is clamped between the back mass 114 and the front mass 116*a*, 116*b*. The fastener is sufficiently tensioned to keep the piezoelectric stack in compression (pre-stressing) at all time due to the low tensile strength of ceramic materials. The back-mass 114, piezoelectric stack (including electrodes), pre-stressing fastener (not shown), and the longitudinal front-mass 116*a*, 116*b* form the exciter section 110 of the resonator 100. The radiator section 130 of the resonator 100 is an object of the present invention, featuring ultrasound radiating body or structure with multiple-orifices. The radiator section 130 includes a threaded stub 134 for connecting to the longitudinal front-mass 116*b* by means of a fastener such as the set-screw 137.

FIG. 2 shows the design principle of the "self-excited" ultrasonic resonator 100 of FIG. 1. The exciter section 110 is designed to operate off-resonance when operated in isolation from the radiator section 130. Resonance operation at the design frequency is only possible when both exciter 110 and radiator sections 130 are coupled together. Those skilled in the art will recognize that longitudinal mode devices are designed such that their axial lengths are multiples of half-wavelengths (λ/2) of the design frequency. A typical longitudinal mode device is designed to have a length of (λ/2) such that the frequency of the fundamental (first) longitudinal mode coincides with the design frequency. Accordingly, longitudinal mode devices having axial lengths that are N-multiples of half wavelengths (λ/2), where N is an integer, of the operation frequency will vibrate in the Nth order longitudinal mode. The expressions relating device axial length (L), wavelength (λ), and frequency ($f_N$) for Nth-order longitudinal mode are given by:

$$L = N\left(\frac{\lambda}{2}\right) \text{ and } \tag{1}$$

$$f_N = \frac{1}{\lambda}\sqrt{\frac{E}{\rho}} \text{ or } \tag{2}$$

$$f_1 = \frac{1}{N\lambda}\sqrt{\frac{E}{\rho}}, \tag{3}$$

where $f_1$ denotes the fundamental (first) longitudinal mode, and $c=\sqrt{E/\rho}$ is the speed of sound in the device given in terms of the bulk modulus of elasticity E (Pa) and density p (kg/m$^3$) of the acoustic medium. The exciter section 110 is principally a longitudinal mode device, except that part of its structure influencing its first longitudinal mode frequency forms part of the radiator section 130 in the form of the threaded connection stud (refer to the radiator section front-mass stub 134 in FIG. 1), a feature of the present invention. Therefore, the exciter section 110 is always shorter than (λ/2), and its isolated operation will always be at a frequency higher than the design frequency of the "self-excited" resonator 100 (comprising both the exciter 110 and radiator sections 130). When both the exciter 110 and radiator sections 130 are tightly coupled (for example, by means of a set-screw fastener 137) the complete resonator assembly then operates in resonance at the design frequency. In this operation, the exciter section 110 vibrates at ultrasonic frequencies in the range of 19 kHz to 1 MHz, more preferably in the range of 19 kHz to 100 kHz, and preferably in its first longitudinal mode; while the radiator section 130 operates in its radial mode, preferably the fundamental radial mode, at the same frequency as the exciter section. Depending on the design requirements, the radiator section may also operate in other radial modes. During operation, the radiator external surfaces vibrate thereby producing ultrasonic waves emitting outwards into a fluid in which the radiator section 130 is disposed, while its internal surfaces (walls of the orifices 131, 132, 133) produce ultrasonic waves emitting towards the center of each orifice. The arrows in FIG. 2, shows the vibration direction during operation.

Figure 3:
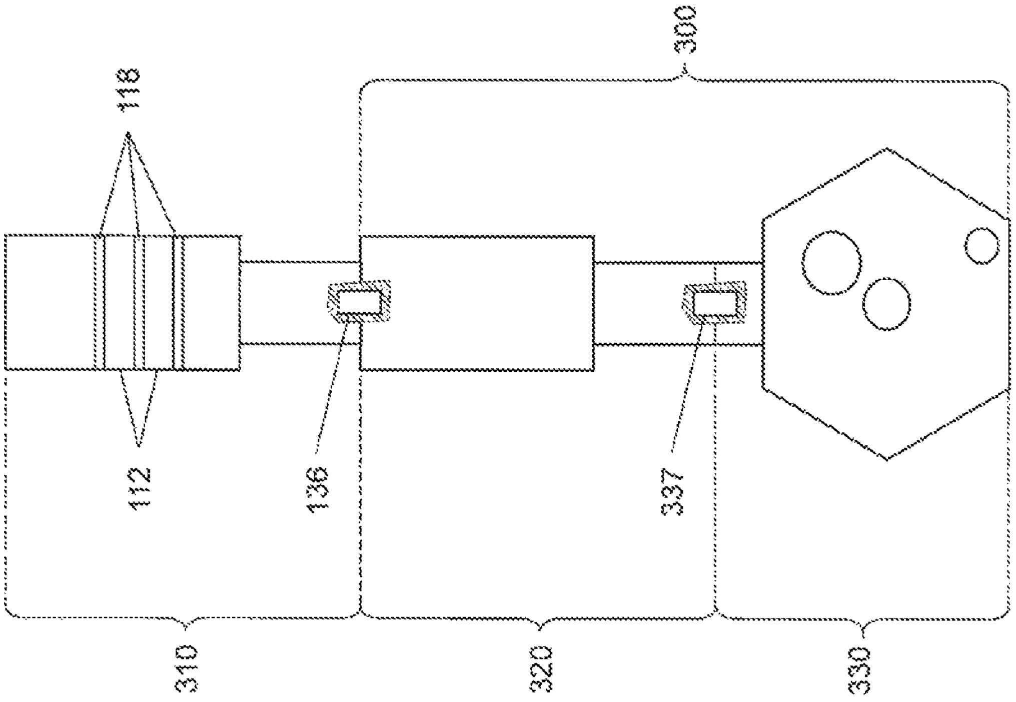
FIG. 3 is a front view of an embodiment comprising an external exciter coupled to an intermediate section which is in turn coupled to a radiator section.

FIG. 3 illustrates an embodiment of the present invention consisting of an external exciter 310, coupled to an intermediate section 320 which is in turn coupled to a radiator section 330. In this embodiment, the external exciter 310 may be obtained from a third-party vendor and serve only as a means of exciting the resonator assembly externally, where the resonator assembly by itself does not have any means of self-excitation. The external exciter 310 is configured to vibrate in a longitudinal and/or torsional mode. The resonator assembly of the present embodiment comprises of the intermediate section 320 and a radiator section 330. The intermediate section 320 functions primarily as a matching structure between the external exciter 310 and the radiator section 330, and secondarily as a booster to amplify the vibrational displacement of the external exciter output face (the face that is coupled to the intermediate section). The complete assembly comprising the external exciter 310, intermediate section 320, and the radiator section 330 operates in resonance at the design frequency.

Figure 4:
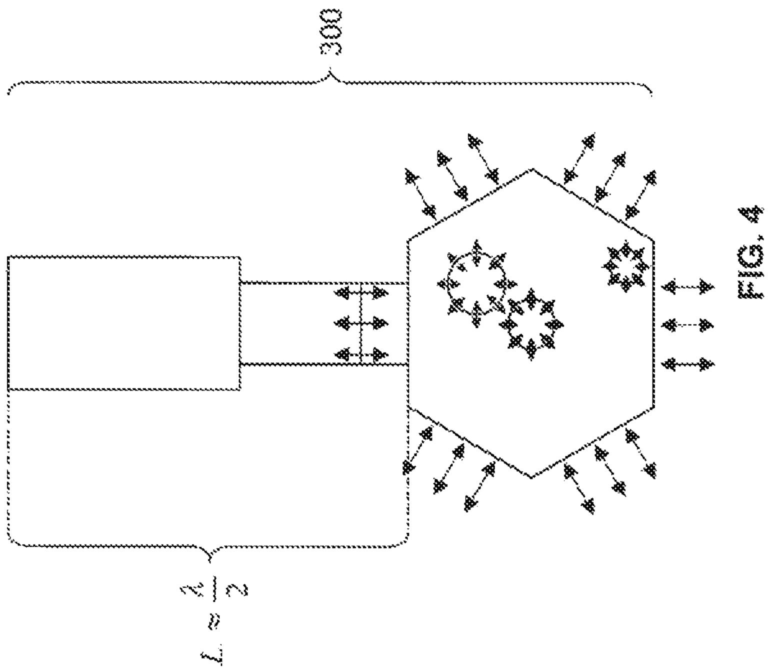
FIG. 4 is a front view of the same embodiment of FIG. 3 showing the vibrational directions at the interface between the external exciter and the intermediate section, at the interface between the intermediate section and the radiator section, external surfaces of the radiator section, and internal surfaces of the radiator section.

FIG. 4 shows the design principle of the "externally-excited" ultrasonic resonator of FIG. 3. The intermediate section 320 is designed to operate off-resonance when operated in isolation from the radiator section 330, and the radiator section 330 is designed to operate off-resonance when operated in isolation from the intermediate section 320. Resonance operation at the design frequency is only possible when both intermediate 320 and radiator sections 330 are coupled together. Those skilled in the art will recognize that longitudinal mode devices are designed based on multiples of half-wavelengths (λ/2) of the operation frequency. The intermediate section 320, as a longitudinal mode device, is designed to half-wavelength (λ/2) except that part of its structure influencing its first longitudinal mode frequency forms part of the radiator section 330 in the form of the threaded connection stud (refer to the radiator section front-mass stub 134 in FIG. 1), a feature of the present invention. Therefore, the intermediate section 320 is always shorter than (λ/2), and its isolated operation will always be higher than the design frequency of the "externally excited" resonator 300 (comprising both the intermediate 320 and radiator sections 330). When both the intermediate 320 and radiator sections 330 are tightly coupled (for example, by means of a set-screw fastener 337) the complete resonator assembly can then be externally excited and achieve resonance at the design frequency. In this operation, the intermediate section 320 vibrates in its first longitudinal mode, while the radiator section 330 operates in its radial mode, preferably the fundamental radial mode. Depending on the design requirements, the radiator section 330 may also operate in other radial modes. During operation, the radiator external surfaces vibrate thereby producing ultrasonic waves emitting outwards into the fluid, while its internal surfaces (walls of the orifices) produce ultrasonic waves emitting towards the center of each orifice. The arrows in FIG. 4, show the vibration directions during operation.

Figure 5:
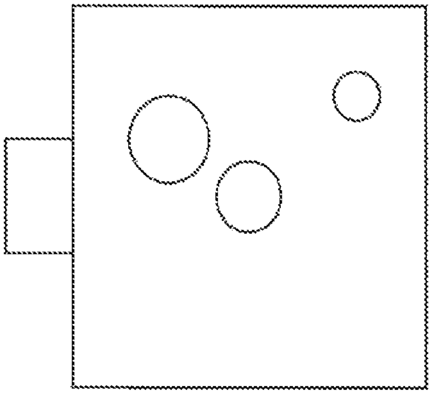
FIG. 5 is a front view of a radiator section having 4 sides, a connection stub with threaded hole, and multiple orifices that are distributed across a face of the radiator body and that penetrate through the radiator body or structure, according to an embodiment.

FIG. 5 shows a radiator section with a quadrilateral face e.g. rectangular face, as an embodiment of the present invention. The radiator section comprises of a threaded connection stub (refer to the radiator section front-mass stub 134 in FIG. 1), and a radiating body or structure with multiple orifices.

Figure 6:
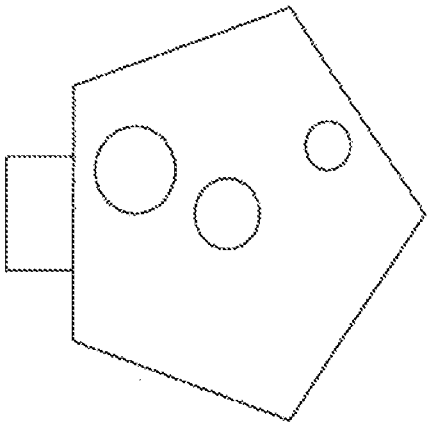
FIG. 6 is a front view of a radiator section having 5 sides, a connection stub with threaded hole, and multiple orifices that are distributed across a face of the radiator body and that penetrate through the radiator body or structure, according to an embodiment.

FIG. 6 shows a radiator section with a pentagonal face, as an embodiment of the present invention. The radiator section comprises of a threaded connection stub (refer to the radiator section front-mass stub 134 in FIG. 1), and a radiating body or structure with multiple orifices.

Figure 7:
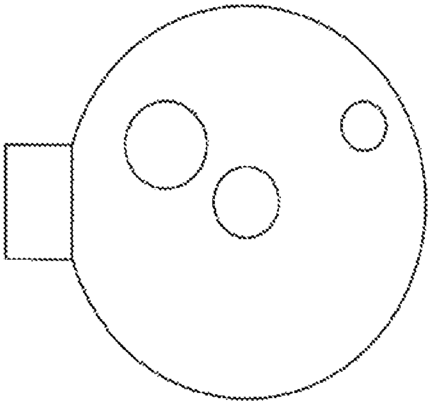
FIG. 7 is a front view of a radiator section having infinitely many sides, a connection stub with threaded hole, and multiple orifices that are distributed across a face of the radiator body and that penetrate through the radiator body or structure, according to an embodiment.

FIG. 7 shows a radiator section with a circular face, as an embodiment of the present invention. The radiator section comprises of a threaded connection stub (refer to the radiator section front-mass stub 134 in FIG. 1), and a radiating body or structure with multiple orifices.

Figure 8:
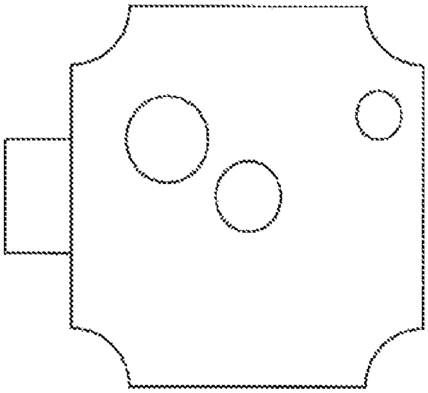
FIG. 8 is a front view of a radiator section having a symmetrical but arbitrary shape, a connection stub with threaded hole, and multiple orifices that are distributed across a face of the radiator body and that penetrate through the radiator body or structure, according to an embodiment.

FIG. 8 shows a radiator section with a complex/arbitrary face, as an embodiment of the present invention. The radiator section comprises of a threaded connection stub (refer to the radiator section front-mass stub 134 in FIG. 1), and a radiating body or structure with multiple orifices.

It is to be noted that the design of the radiator section of the present invention is not limited to the embodiments shown in FIG. 5 to FIG. 8. Those figures only serve as examples of the possible flexibilities in the design of the ultrasonic resonator of the present invention relating to the ultrasonic radiator with multiple orifices and a threaded connection stub, where the latter forms part of the exciter section or the intermediate section of the "self-excited" resonator and the "externally-excited" resonator respectively.

Figure 9C:
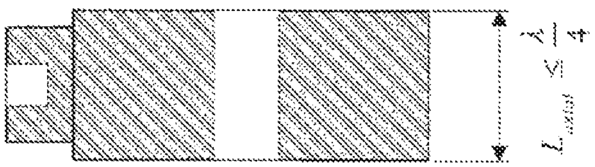
FIG. 9*c* is a section A-A view of FIG. 9*a*, for axial lengths $L_{axial} \leq \lambda/4$ according to an embodiment, where there is shown the primary orifice, and a threaded hole in the connection stub.
Figure 9B:
FIG. 9*b* is a side view of FIG. 9*a*, for axial lengths $L_{axial} \leq \lambda/4$ according to an embodiment.
Figure 9A:
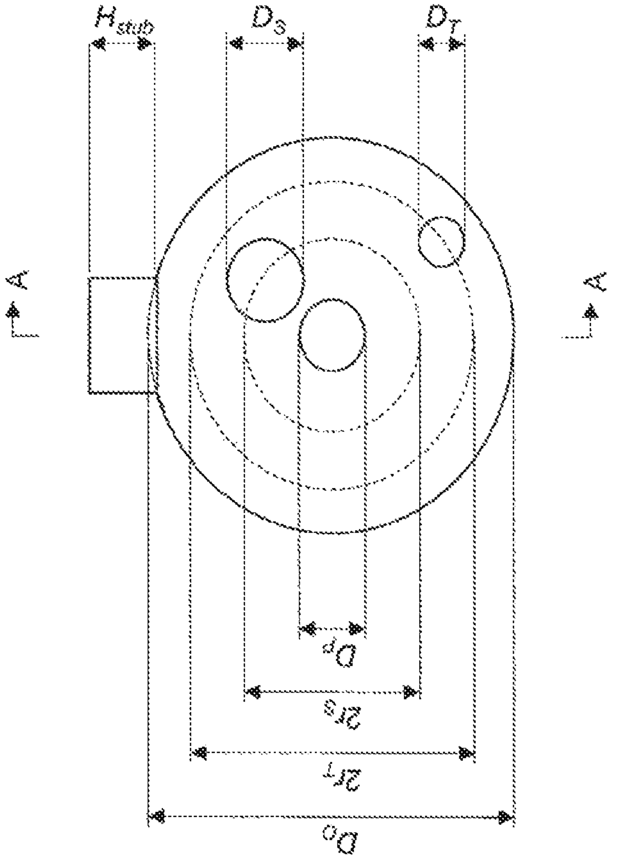
FIG. 9*a* is a front view of a radiator section having a circular face with multiple orifices that are distributed across its face and that penetrate through the radiator body or structure, according to an embodiment.

A circular face multiple-orifice radiator section is shown in FIG. 9*a* as an embodiment of the present invention. A circular radiator section having diameter $D_o$ and multiple orifices is described as having 3 levels of orifices namely a primary orifice, secondary orifices, and tertiary orifices. It is to be noted that the number of levels of orifices need not be limited to 3 but must have at least 2 levels to satisfy the definition of multiple-orifices of the present invention. The primary orifice is positioned in the center of the radiator, and in the case of the present embodiment, concentric with the circular face. Secondary orifices are positioned at a radius $r_S$ from the center of the primary orifice. In the present embodiment, secondary orifices are circular and has diameter $D_S$. The position, diameter, and quantity of secondary orifices are not limited to any number, but only by the design requirements and geometrical constraints. Tertiary orifices are positioned at a radius $r_T$ from the center of the primary orifice, where $r_T$ is greater than $r_S$. In the present embodiment, tertiary orifices are circular and has diameter of $D_T$. The position, diameter, and quantity of tertiary orifices are not limited to any number, but only by the design requirements and geometrical constraints. It is to be appreciated that orifices at higher orifice levels, e.g. secondary and tertiary orifices, are arranged at increasing radial distance from the lowest orifice level, i.e. primary orifice, with increasing orifice level.

FIG. 9*b* and FIG. 9*c* show the side view and the section A-A view of the circular radiator section of FIG. 9*a*, for radiator section axial length, $L_{axial}$ less than or equal to λ/4. Those skilled in the art will appreciate that $L_{axial}$ less than or equal to λ/4 places the axial, bending, torsional, flexural and other complex modes related to the propagation of ultrasonic energy other than in the radial direction, at much higher frequency than the operation frequency, preventing the excitation of these parasitic modes. It is to be noted that FIG. 9*b* and FIG. 9*c* is also applicable to radiator section faces of FIG. 5, FIG. 6, FIG. 7, FIG. 8, FIG. 10, FIG. 11, FIG. 12, FIG. 13, FIG. 14, FIG. 15, FIG. 16, and FIG. 17, but not limited to these embodiments.

Figure 9E:
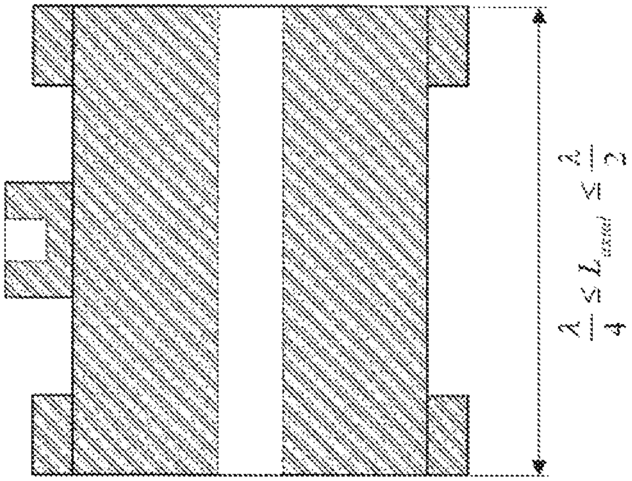
FIG. 9*e* is a section A-A view of FIG. 9*a*, for axial lengths $\lambda/4 \leq L_{axial} \leq \lambda/2$ according to an embodiment, where there is shown the primary orifice, and a threaded hole in the connection stub, and further features mass additions and/or subtraction that are not limited in size, shape, and position of the radiator section, according to an embodiment.
Figure 9D:
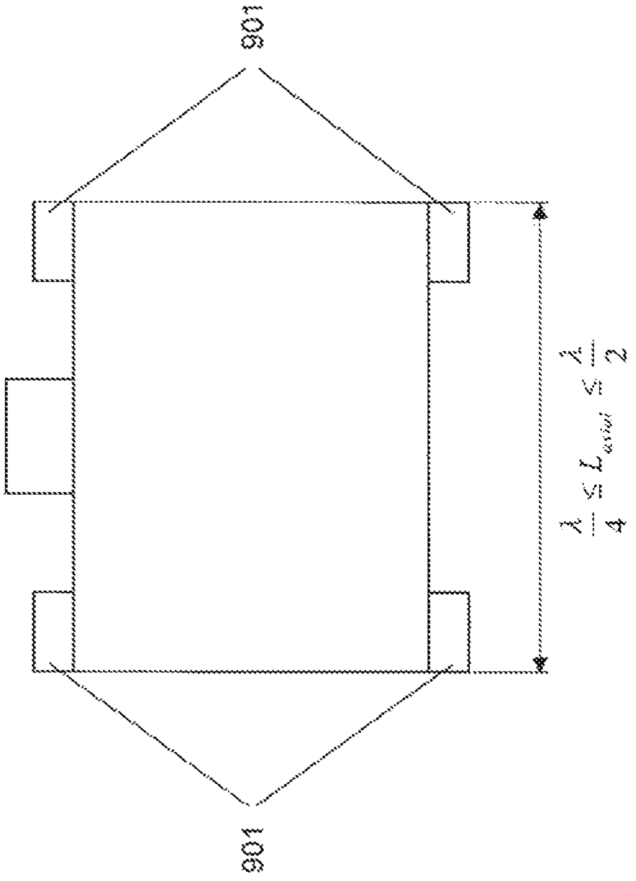
FIG. 9*d* is a side view of FIG. 9*a*, for axial lengths $\lambda/4 \leq L_{axial} \leq \lambda/2$ according to an embodiment, and further features mass additions and/or subtraction that are not limited in size, shape, and position of the radiator section.

FIG. 9*d* and FIG. 9*e* show the side view and the section A-A view of the circular radiator section of FIG. 9*a*, for radiator section axial length, $L_{axial}$ greater than or equal to λ/4 and less than or equal to λ/2, and further features mass additions 901 and/or subtraction that are not limited in size, shape, and position of the radiator section. In applications where it is necessary to have $L_{axial}$ larger than λ/4 (for increasing ultrasonic exposure of a passing fluid, for example), longer $L_{axial}$ necessitates the addition of mass in appropriate positions to ensure even vibrational displacement. Those skilled in the art will appreciate that the addition of castellation, or slots or similar addition or subtraction of mass from the structure helps to even out the vibration of thick structures. A similar approach to the design and optimization of block horns can be adapted for the design and optimization of thick multiple orifice radiators. It is to be noted that FIG. 9*d* and FIG. 9*e* are also applicable to radiator section faces of FIG. 5, FIG. 6, FIG. 7, FIG. 8, FIG. 10, FIG. 11, FIG. 12, FIG. 13, FIG. 14, FIG. 15, FIG. 16, and FIG. 17, but not limited to these embodiments.

Figure 10:
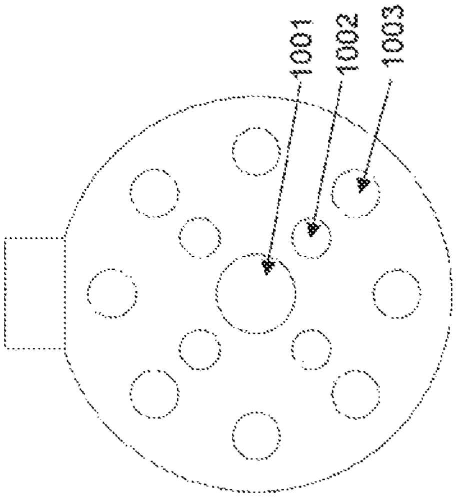
FIG. 10 is a front view of a radiator section described in FIG. 9(*a-e*), as an embodiment of the present invention, showing 1 (one) primary orifice, 4 (four) secondary orifices, and 8 (eight) tertiary orifices, where the primary, secondary, and tertiary orifices are of different sizes.

The versatility to the multiple-orifice radiator design of the present invention, specifically but not limiting to the circular face radiator section design described in FIG. 9*a* is exemplified in the following illustrations:

FIG. 10 shows a circular face radiator section with 3 (three) orifice levels consisting of 1 (one) primary orifice at the center of the circular face, 4 (four) secondary orifices surrounding the primary orifice, and 8 (eight) tertiary orifices surrounding the secondary orifice layer, as an embodiment of the present invention. Further, there is shown in this example the use of different orifice size for the different orifice levels.

Figure 11:
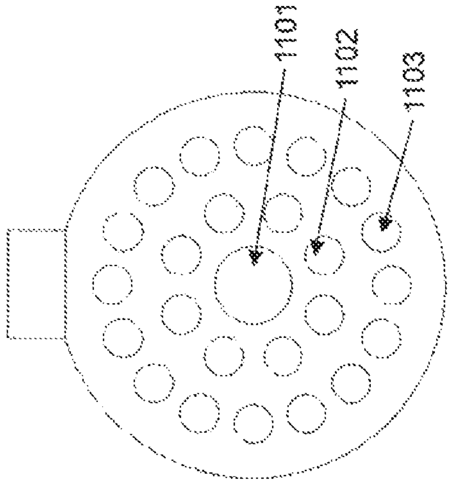
FIG. 11 is a front view of a radiator section described in FIG. 9(*a-e*), as an embodiment of the present invention, showing 1 (one) primary orifice, 8 (four) secondary orifices, and 16 (eight) tertiary orifices, where the secondary and tertiary orifices are of the same size.

FIG. 11 shows a circular face radiator section with 3 (three) orifice levels consisting of 1 (one) primary orifice at the center of the circular face, 8 (eight) secondary orifices surrounding the primary orifice, and 16 (sixteen) tertiary orifices surrounding the secondary orifice layer, as an embodiment of the present invention. Further, there is shown in this example the use of the same orifice size for the secondary and tertiary orifice levels.

Both FIG. 10 and FIG. 11 illustrate the versatility of the multiple-orifice radiator design where there is no restriction to the size and position of the orifices, with the exception of the primary orifice which must always be in the geometric center of the radiator face and must always be singular, as one of the feature of the present invention. The exact size and position of the orifices is defined by the requirement of the operating mode shape(s), modal frequencies, and size of the radiator section, as required by the application. Those skilled in the art will recognize that fine adjustment of orifice sizes, positions, and quantities is part of the frequency tuning process for any ultrasound radiating devices.

Figure 12:
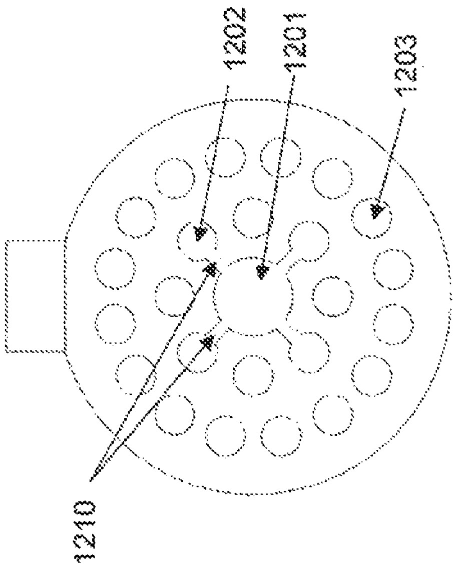
FIG. 12 is a front view of a radiator section described in FIG. 9(*a-e*), as an embodiment of the present invention. In this figure, there is shown partial connection between secondary orifices and primary orifice by means of orifice links.

Further, it is also possible to introduce 'orifice-links' as a means of tuning the device, as a means of increasing the radiating surface area, and as a means of reducing the mass of the radiator, as one of the feature of the present invention. An orifice-link connects one orifice to another and further the orifice-links can be configured in any one of the following non-limiting ways: (1) One orifice from an orifice level to one orifice from a different or adjacent orifice level; (2) One orifice from an orifice level to one orifice from the same orifice level; (3) one orifice from an orifice level to two or more orifices from a different or adjacent orifice level; (4) One orifice from an orifice level to two orifices from the same orifice level; (5) one orifice from an orifice level to one or more orifices from a different or adjacent orifice level and further one or more orifices from yet another adjacent orifice level. The following figures exemplify the use of orifice-links in multiple-orifice radiator section designs:

FIG. 12 shows a circular face multiple-orifice radiator section with 4 (four) orifice-links 1210 connecting 4 (four) out of 8 (eight) secondary orifices 1202 to the primary orifice 1201, as an embodiment.

Figure 13:
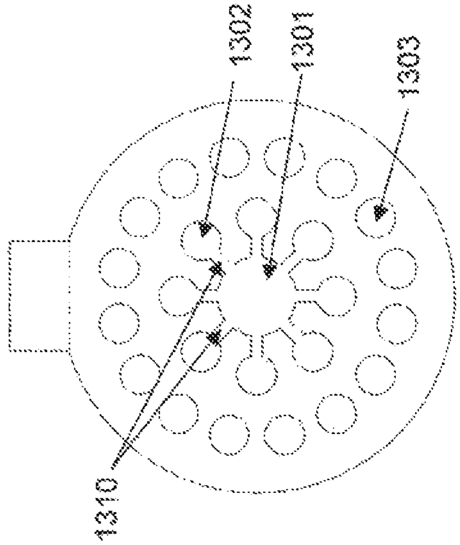
FIG. 13 is a front view of a radiator section described in FIG. 9(*a-e*), as an embodiment of the present invention. In this figure, there is shown full connection between secondary orifices and primary orifice by means of orifice links.

FIG. 13 shows a circular face multiple-orifice radiator section with 8 (eight) orifice-links 1310 connecting 8 (eight) out of 8 (eight) secondary orifices 1302 to the primary orifice 1301, as an embodiment.

Figure 14:
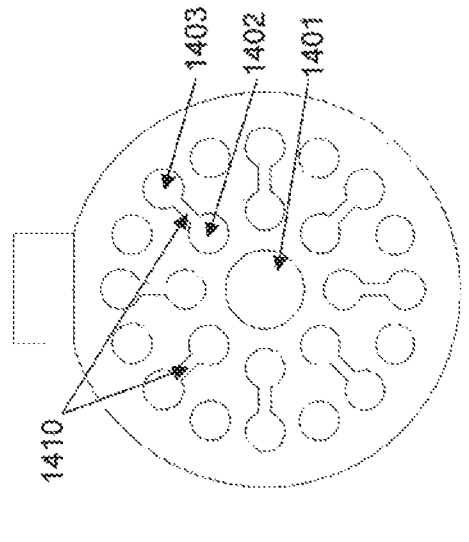
FIG. 14 is a front view of a radiator section described in FIG. 9(*a-e*), as an embodiment of the present invention. In this figure, there is shown partial connection between tertiary orifices and secondary orifices by means of orifice links.

FIG. 14 shows a circular face multiple-orifice radiator section with 8 (eight) orifice-links 1410 connecting 8 (eight) out of 16 (sixteen) tertiary orifices 1403 to 8 (eight) out of 8 (eight) secondary orifices 1402, and no orifice connection to the primary orifice 1401, as an embodiment.

Figure 15:
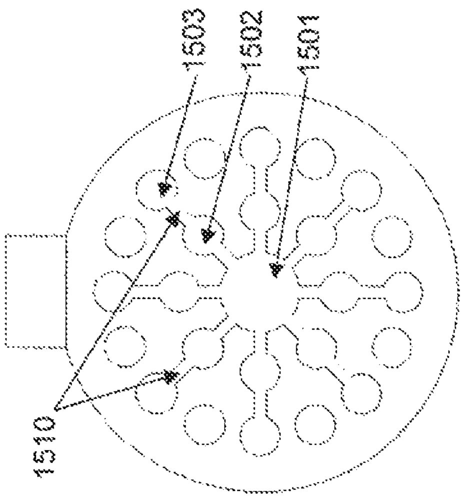
FIG. 15 is a front view of a radiator section described in FIG. 9(*a-e*), as an embodiment of the present invention. In this figure, there is shown partial connection between tertiary orifices and secondary orifices by means of orifice links, and full connection between secondary orifices and the primary orifice by means of orifice links.

FIG. 15 shows a circular face multiple-orifice radiator section with 8 (eight) orifice-links 1510 connecting 8 (eight) out of 16 (sixteen) tertiary orifices 1503 to 8 (eight) out of 8 (eight) secondary orifices 1502, and in addition 8 (eight) orifice-links connecting 8 (eight) out of 8 (eight) secondary orifices 1502 to the primary orifice 1501, as an embodiment.

Figure 16:
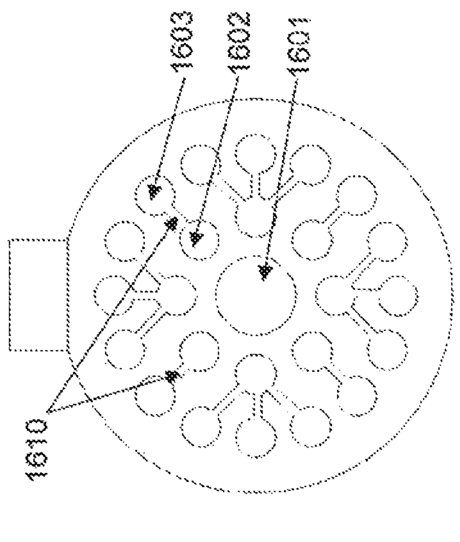
FIG. 16 is a front view of a radiator section described in FIG. 9(*a-e*), as an embodiment of the present invention. In this figure, there is shown full connection between tertiary orifices and secondary orifices by means of orifice links. Further, there is shown a combination of connection configurations, i.e. the connection of 3 tertiary orifices to 1 secondary orifice, and the connection of 1 tertiary orifice to 1 secondary orifice.

FIG. 16 shows a circular face multiple-orifice radiator section with 16 (sixteen) orifice-links 1610 connecting 16 (sixteen) out of 16 (sixteen) tertiary orifices 1603 to 8 (eight) out of 8 (eight) secondary orifices 1602, where 4 (four) of the tertiary orifices 1603 are each connected to 1 (one) secondary orifice 1602, and 12 (twelve) of the remaining tertiary orifices 1603 are connected to the remaining 4 (four) secondary orifices 1602 such that a group of 3 (three) tertiary orifices 1603 are connected to 1 (one) secondary orifice 1602, and no orifice connection to the primary orifice 1601, as an embodiment.

Figure 17:
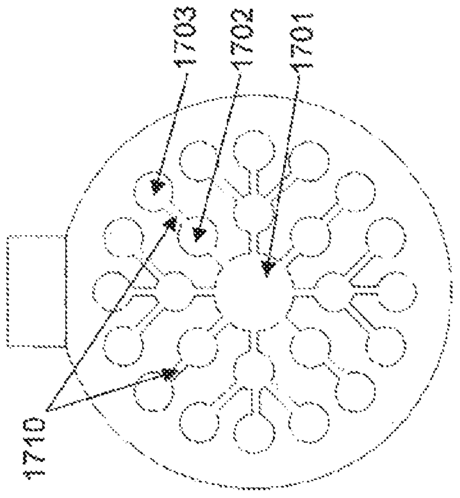
FIG. 17 is a front view of a radiator section described in FIG. 9(*a-e*), as an embodiment of the present invention. In this figure, there is shown full connection between tertiary orifices and secondary orifices by means of orifice links. Further, there is shown a combination of connection configurations, i.e. the connection of 3 tertiary orifices to 1 secondary orifice, and the connection of 1 tertiary orifice to 1 secondary orifice. Still further, there is shown full connection between secondary orifices to the primary orifice by means of orifice links.

FIG. 17 shows a circular face multiple-orifice radiator section with 16 (sixteen) orifice-links 1710 connecting 16 (sixteen) out of 16 (sixteen) tertiary orifices 1703 to 8 (eight) out of 8 (eight) secondary orifice 1702, where 4 (four) of the tertiary orifices 1703 are each connected to 1 (one) secondary orifices 1702, and 12 (twelve) of the remaining tertiary orifices 1703 are connected to the remaining 4 (four) secondary orifices 1702 such that a group of 3 (three) tertiary orifices 1703 are connected to 1 (one) secondary orifice

1702; and further 8 (eight) orifice-links 1710 connecting 8 (eight) secondary orifices 1702 to the primary orifice 1701, as an embodiment.

FIG. 5 to FIG. 17 inclusive serve as examples of the flexibility of the multiple-orifice configuration, where the primary, secondary, tertiary, quaternary, etc. orifices are not limited in size, quantities, positions, and shapes.

Figure 18:
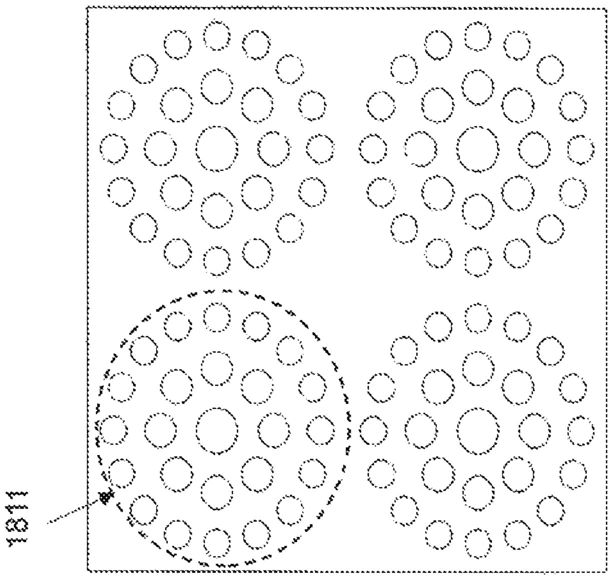
FIG. 18 is a front view of a 4-sided radiator section with an array of orifices, where each member of the array consists of a primary orifice, secondary orifices, and tertiary orifices, as an embodiment.

FIG. 18 shows a 4-sided radiator section with an array of orifices, where each member 1811 of the array consists of a primary orifice, secondary orifices, and tertiary orifices, as an embodiment. The shape of the radiator section is not limited to having any number of sides, further it is possible to design such multiple-orifice radiator with 3-sides to infinite number of sides. The number of members in the array, where each member 1811 is a collection of primary orifice, secondary orifices, tertiary orifices, quaternary orifices, and which the number of levels of orifices is not limited to any number. In this figure, there is shown a radiator section with 4 (four) array members 1811, and which each array member 1811 comprises 1 (one) primary orifice, 8 (eight) secondary orifices, and 16 (sixteen) tertiary orifices.

Figure 19:
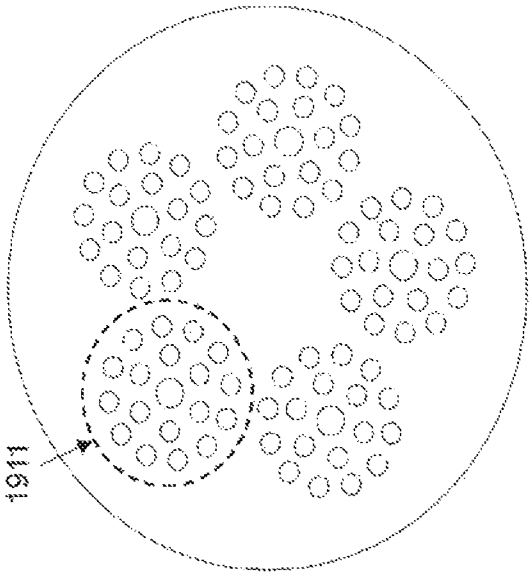
FIG. 19 is a front view of an infinite-sided radiator section with an array of orifices, where each member of the array consists of a primary orifice, secondary orifices, and tertiary orifices, as an embodiment.

FIG. 19 shows an infinite-sided radiator section with an array of orifices, where each member 1911 of the array consists of a primary orifice, secondary orifices, and tertiary orifices, as an embodiment. The shape of the radiator section is not limited to having any number of sides, further it is possible to design such multiple-orifice radiator with 3-sides to infinite number of sides. The number of members in the array, where each member 1911 is a collection of primary orifice, secondary orifices, tertiary orifices, quaternary orifices, and which the number of levels of orifices is not limited to any number. In this figure, there is shown a radiator section with 5 (five) array members 1911, and which each array member 1911 comprises 1 (one) primary orifice, 6 (six) secondary orifices, and 12 (twelve) tertiary orifices.

Orifice-links can also be applied to the embodiments of FIG. 18 and FIG. 19, in a similar arrangement as shown in FIG. 12 to FIG. 17, but not limited to these examples.

Figure 20B:
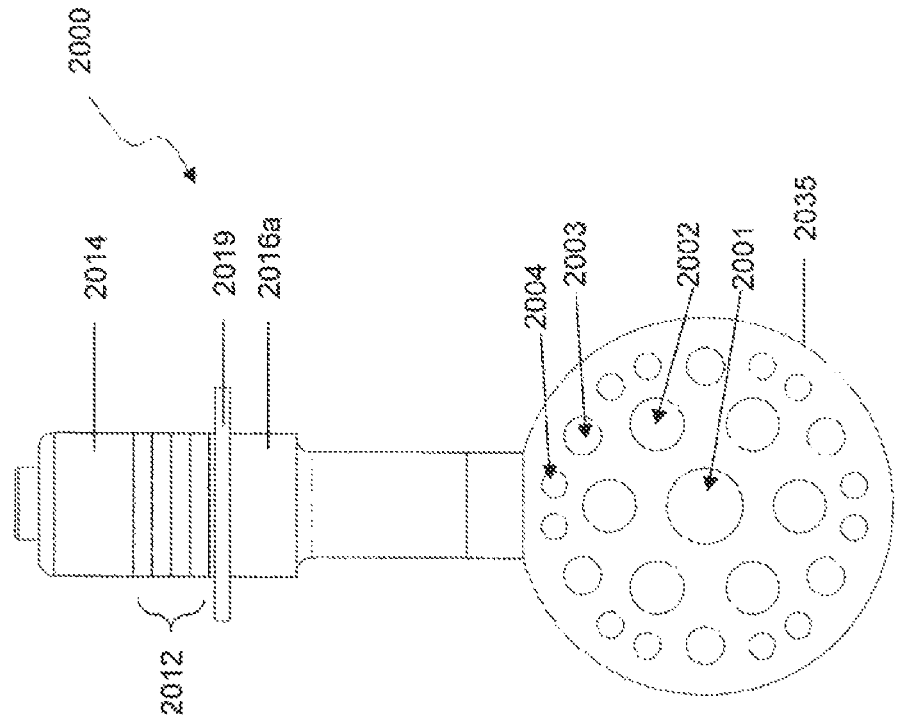
FIG. 20*b* is the front view of the embodiment of FIG. 20*a*.
Figure 20A:
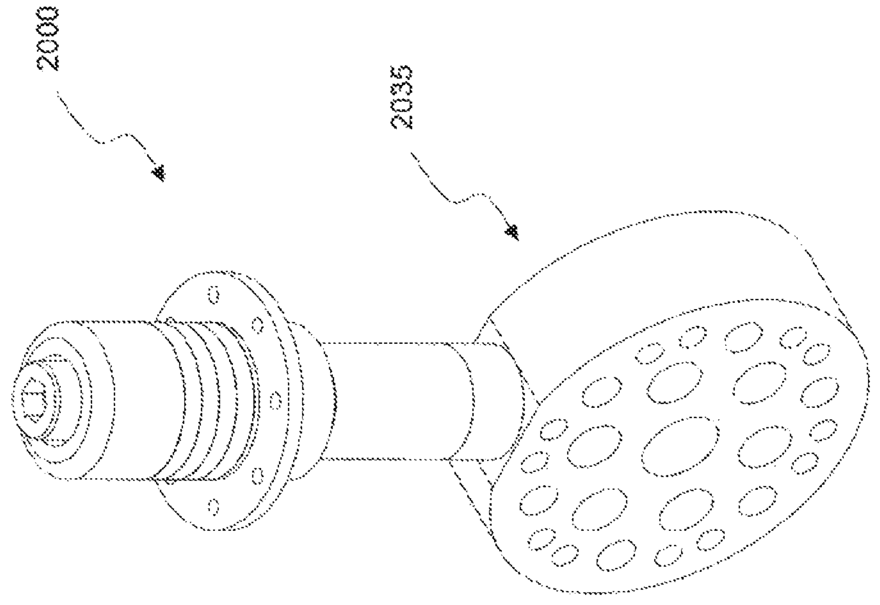
FIG. 20*a* is an isometric view of an embodiment showing the complete assembly at least comprising an exciter section coupled to a circular multiple orifice radiator section, where the orifice sizes, positions, and quantities are not limited to the illustrated embodiment.

FIG. 20*a* and FIG. 20*b* show perspective and front views of the complete self-excited multiple orifice resonator assembly 2000 comprising of the back-mass 2014, piezoelectric stack 2012, the longitudinal front-mass 2016*a*, prestressing bolt (clamping fastener), and the multiple-orifice radiator section 2035 with a primary orifice 2001, secondary orifices 2002, tertiary orifices 2003, and quaternary orifices 2004, as an embodiment. The exciter section includes a mounting flange 2019 arranged at a nodal region of the vibrations and dimensioned to prevent wetting of active electromechanical elements comprised in the exciter section upon mounting the ultrasonic resonator assembly 2000 into a pipe or tank. Examples of electromechanical elements include but are not limited to piezoelectric elements 112 or magneto-restrictive elements. It is to be noted that any of the examples shown in FIG. 5 to FIG. 17, but not limiting to these examples, can replace the multiple-orifice radiator section 2035 shown in this figure to from the complete assembly of the multiple-orifice resonator of the present invention.

Advantages of the invention include, but are not limited to, the following:

(a) The provision of a plurality of orifices on an ultrasonic radiator section, which are arranged as at least two orifice levels, increases radiating surface area without increasing structural mass of the ultrasonic resonator section and electrical consumption requirements.

(b) An ultrasonic radiator which leads to a reduction in use of ultrasonic transducers and generators since there is no increase in power consumption requirements to provide increase in flow rate.

(c) An ultrasonic radiator that is capable of distributing the acoustic energy to the vibrating surfaces and delay the onset of bubble-shielding resulting in the ability to drive the radiator at much higher power than similar devices with smaller radiating surface areas.

(d) An ultrasonic radiator that is capable of generating high acoustic pressures in the orifices to produce more intense cavitation effects.

(e) An ultrasonic radiator that generates acoustic waves and cavitation energy more efficiently due to the large radiating surface area to mass ratio.

(f) Orifice-links can be provided to connect an orifice to one or more orifices from the same and/or different orifice levels. This provides an alternative method of tuning, mass reduction, and increase internal radiating surface area.

(g) The exciter section has axial length that is less than half-wavelength, wherein the remaining axial length making up the complete half-wavelength form part of the radiator section. There are several advantages resulting from this two-part design, including but not limited to the following:

- (i) The two-part design allows the resonator to be easily installed in the pipe via a smaller insertion port of the pipe. If the resonator were to a single piece design, the insertion port will have to be larger than the lateral dimension of the radiator. The two-part design only requires the insertion port to be wide enough for the exciter section to fit.
- (ii) The radiator section, which is mostly in contact with the abrasive seawater and also subject to the destructive effects of cavitation bubbles, wears faster than the exciter section. The two-part design allows the replacement of the radiator section only when required, thereby reducing the maintenance cost.

It is to be understood that the embodiments and features described above should be considered exemplary and not restrictive. For example, the above-described embodiments may be used in combination with each other. Many other embodiments will be apparent to those skilled in the art from consideration of the specification and practice of the invention. The scope of the invention should, therefore, be determined with reference to the appended claims, along with the full scope of equivalents to which such claims are entitled. Furthermore, certain terminology has been used for the purposes of descriptive clarity, and not to limit the disclosed embodiments of the invention.

What is claimed is:

1. An ultrasonic resonator comprising:

an exciter section having a longitudinal axis and dimensioned to be resonant in a direction along the longitudinal axis when the exciter section is energized with high frequency vibrations; and a radiator section having a connection stub and coupled to the exciter section through the connection stub, wherein the radiator section is configured to receive the vibrations from the exciter section and transmit the vibrations as acoustic waves, wherein an axial length of the exciter section is less than a half-wavelength, wherein the connection stub completes the half-wavelength when coupled to the exciter section to allow the ultrasonic resonator operate in resonance at design frequency.

2. The ultrasonic resonator of claim 1, wherein the radiator section includes a radiator body having at least three sides to provide a plurality of external radiating surfaces, and two opposite faces having a plurality of orifices formed therein, wherein walls of the orifices are configured to provide a plurality of internal radiating surfaces, and wherein the internal and the external surfaces are configured to transmit the vibrations as acoustic waves.

3. The ultrasonic resonator of claim 2, wherein the orifices are arranged as a plurality of orifice levels, wherein orifices of each orifice level, other than a primary orifice level having a single orifice, are centered about the single orifice and arranged at increasing radial distance from the single orifice with increasing orifice level.

4. The ultrasonic resonator of claim 3, wherein the radiator body is provided with a plurality of orifice-links connecting at least some of the orifices of adjacent orifice levels.

5. The ultrasonic resonator of claim 3, wherein the radiator body is provided with a plurality of orifice-links connecting at least some of the orifices of adjacent orifice levels other than the single orifice of the primary orifice level.

6. The ultrasonic resonator of claim 3, wherein at least some of the orifices having depths which partially extend through a thickness of the radiator body.

7. The ultrasonic resonator of claim 3, wherein at least some of the orifices having depths which fully extend through a thickness of the radiator body.

8. The ultrasonic resonator of claim 1, wherein the exciter section includes an electromechanical energy conversion device configured to generate the vibrations.

9. The ultrasonic resonator of claim 1, wherein the exciter section being substantially cylindrical with circular cross-sections having variable diameters.

10. The ultrasonic resonator of claim 1, wherein the exciter section includes a mounting flange arranged at a nodal region of the vibrations and dimensioned to prevent wetting of active electromechanical elements of the exciter section upon mounting the ultrasonic resonator into a pipe or tank.

11. An ultrasonic radiator section comprising:
- a radiator body having an array of orifices, wherein each member of the array comprises a plurality of orifices arranged as a plurality of orifice levels, wherein orifices of each orifice level, other than a primary orifice level having a single orifice, are centered about the single orifice and arranged at increasing radial distance from the single orifice with increasing orifice level.

12. The ultrasonic radiator section of claim 11, wherein a number of orifices in the primary orifice level is the same as a number of array members.

13. The ultrasonic radiator section of claim 12, wherein the radiator body is provided with a plurality of orifice-links connecting at least some of the orifices of adjacent orifice levels.

14. The ultrasonic radiator section of claim 12, wherein the radiator body is provided with a plurality of orifice-links connecting at least some of the orifices of adjacent orifice levels other than the single orifice of the primary orifice level.

15. An ultrasonic resonator comprising:
- an intermediate section adapted to be connected to an external exciter and having a longitudinal axis and dimensioned to be resonant in a direction along the longitudinal axis when the intermediate section is energized with high frequency vibrations from the external exciter;
- a radiator section having a connection stub and coupled to the intermediate section through the connection stub, wherein the radiator section is configured to receive the vibrations from the intermediate section and transmit the vibrations as acoustic waves, wherein an axial length of the intermediate section is less than a half-wavelength,
- wherein the connection stub completes the half-wavelength when coupled to the intermediate section to allow the ultrasonic resonator operate in resonance at design frequency.

16. The ultrasonic resonator of claim 15, wherein the radiator section includes a radiator body having at least three sides to provide a plurality of external radiating surfaces, and two opposite faces having a plurality of orifices formed therein, wherein walls of the orifices are configured to provide a plurality of internal radiating surfaces, and
- wherein the internal and the external surfaces are configured to transmit the vibrations as acoustic waves.

17. The ultrasonic resonator of claim 16, wherein the orifices are arranged as a plurality of orifice levels, wherein orifices of each orifice level, other than a primary orifice level having a single orifice, are centered about the single orifice and arranged at increasing radial distance from the single orifice with increasing orifice level.

18. The ultrasonic resonator of claim 17, wherein the radiator body is provided with a plurality of orifice-links connecting at least some of the orifices of adjacent orifice levels.

19. The ultrasonic resonator of claim 17, wherein the radiator body is provided with a plurality of orifice-links connecting at least some of the orifices of adjacent orifice levels other than the single orifice of the primary orifice level.

* * * * *